(12) United States Patent
Solie

(10) Patent No.: US 6,930,520 B2
(45) Date of Patent: Aug. 16, 2005

(54) HIGH BANDWIDTH FEED-FORWARD OSCILLATOR

(75) Inventor: Eric M. Solie, Durham, NC (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/784,365

(22) Filed: Feb. 23, 2004

(65) Prior Publication Data

US 2004/0227549 A1 Nov. 18, 2004

Related U.S. Application Data

(60) Provisional application No. 60/470,071, filed on May 13, 2003.

(51) Int. Cl.$^7$ ................................................. H03K 4/06
(52) U.S. Cl. ....................... 327/131; 327/140; 327/172; 363/41
(58) Field of Search ................................ 327/131–138, 327/172, 140; 363/40–41

(56) References Cited

U.S. PATENT DOCUMENTS 5,250,879 A * 10/1993 Koblitz ........................ 315/403
6,819,154 B2 * 11/2004 Greenfeld .................... 327/172

* cited by examiner

Primary Examiner—Dinh T. Le
(74) Attorney, Agent, or Firm—Allen, Dyer, Dopplet, Milbrath & Gilchrist, P.A.

(57) ABSTRACT

A high bandwidth, feed-forward oscillator generates a ramp or sawtooth voltage for controlling the operation of a pulse width modulator-based, switched DC power supply circuit. The oscillator is operative to effectively immediately adjust the slope of each rising and falling portion of the ramp/sawtooth signal, as necessary, in proportion to the magnitude of the input voltage, while maintaining the frequency of the ramp waveform effectively constant. A comparator network establishes a difference between peak and valley portions of the sawtooth in accordance with input voltage. In response to a change in input voltage a control circuit modifies the value of the difference between the peak and valley portions to define a new set of respective peak and valley portions $Vpeak_{NEW}$ and $Vvalley_{NEW}$, and immediately causes the sawtooth waveform to transition to the new set of respective peak and valley portions $Vpeak_{NEW}$ and $Vvalley_{NEW}$ at said prescribed frequency.

13 Claims, 2 Drawing Sheets

HIGH BANDWIDTH FEED-FORWARD OSCILLATOR

CROSS-REFERENCE TO RELATED APPLICATION

The present application claims the benefit of co-pending U.S. application Ser. No. 60/470,071, filed May 13, 2003, entitled: "High Bandwidth Feed-Forward Oscillator," by E. Solie, assigned to the assignee of the present application and the disclosure of which is incorporated herein.

FIELD OF THE INVENTION

The present invention relates in general to electronic circuits and components therefor, and is particularly directed to a high bandwidth, feed-forward oscillator of the type that may be used to generate a ramp or sawtooth voltage for controlling the operation of a pulse width modulator-based, switched DC power supply circuit. As will be described, the feed-forward oscillator of the invention is operative to effectively immediately adjust the slope of each rising and falling portion of the ramp/sawtooth signal, as necessary, in proportion to the magnitude of the input voltage, while maintaining the frequency of the ramp waveform effectively constant.

BACKGROUND OF THE INVENTION

Electrical power for an integrated circuit (IC) is typically supplied by one or more direct current (battery) power sources, such as a pulse width modulation (PWM)-based, DC—DC converter. This type of converter contains a PWM signal generator that supplies a synchronous PWM signal to a switching circuit driver. The switching circuit drive, in turn, controls the on-time and off-time of electronic power switching devices (such as a pair of FETs connected between a pair of power supply rails). A common node between the two FETs is coupled through an inductor to a load reservoir capacitor, with the connection between the inductor and the capacitor serving as an output node from which a desired (regulated) DC output voltage is applied to the load.

The pulse width modulator (PWM) circuit itself is typically implemented using a comparator which compares an output voltage from a control amplifier with a ramp waveform signal. The comparator output has a first state when the output voltage of the control amplifier is greater than the ramp waveform, and a second state when the voltage level of the ramp waveform has a value greater than the output voltage of the control amplifier. Thus, the duty cycle of the PWM waveform may be controlled by the output voltage of the control amplifier.

The ramp waveform signal itself may be generated by means of a feed-forward oscillator of the type diagrammatically illustrated in FIG. 1, wherein the peak-to-valley of the ramp voltage is made proportional to an input voltage Vin. In the circuit of FIG. 1, the input voltage Vin is coupled to a voltage divider comprised of a first resistor 11 having a resistor value R11=(N−1)R and a second resistor 12 having a resistor value R12=R coupled in series between Vin and ground (GND). The common connection 13 of resistors 11 and 12 supplies a voltage Vamplitude or Va. Owing to the values of resistors 11 and 12, Va is proportional to the input voltage Vin by a fraction 1/N; namely, Va=Vin/N.

This fractional voltage Vin/N is summed in an adder 20 with a voltage Vvalley that is supplied as a reference ramp floor or lower voltage input to the oscillator, to produce a peak voltage value Vpeak=Vin/N+Vvalley. The peak voltage Vpeak is coupled to a high side terminal H of a controlled switch 30, a common terminal 31 of which is coupled to a ramp output terminal 40. A capacitor C is coupled between the ramp output terminal 40 and ground. A low side terminal L of switch 30 is coupled to a current sink 50, the current through which is controlled by a phase locked loop (PLL) 60, which has a relatively low bandwidth (e.g., on the order of 3 KHz) to satisfy the linearity requirements of the ramp.

A variable switch connection 32 of switch 30 is alternately coupled between its common terminal 31 and the H and L terminals, in accordance with a reference clock signal REF CLOCK shown at 201 in the timing diagram of FIG. 2, which varies between high and low states, and serves as the reference clock signal for the PLL 60. When the REF CLOCK 201 is high, the variable switch connection 32 is coupled to receive the peak voltage Vpeak at the high side terminal H of switch 30; when the REF CLOCK 201 is low, variable switch connection 32 is coupled to terminal L and current sink 50.

The voltage Vvalley is further applied to a first (+) input 71 of a comparator 70, a second (−) input 72 of which is coupled to the ramp output terminal 40. The output 73 of comparator 70, which is coupled to the PLL 60, has a first state as long the voltage at its second input 72 is greater than that applied to its first input 71, and changes to a second state when the voltage at its second input drops below the voltage applied to its first input. Thus, comparator 70 produces an edge or transition in response to the voltage at the ramp output terminal 40 reaching the valley voltage.

Operation of the feed-forward oscillator of FIG. 1 may be understood by reference to the timing diagram of FIG. 2. Assuming a steady state operation for a first interval 81 of the input voltage Vin, then during the interval 201 that the REF CLOCK 200 is high, the variable switch connection 32 will be coupled to receive the peak voltage Vpeak at the high side terminal H, as pointed out above. As shown by the increasing excursion 211 of ramp waveform 210, this causes capacitor C to be rapidly charged to the value of the peak voltage Vpeak which, as noted earlier, equals the sum of the valley voltage Vvalley and a (1/N) fraction of the input voltage Vin.

During the succeeding low portion 202 of the REF CLOCK cycle 200, the variable switch connection 32 is coupled to the current sink 50, discharging the capacitor C. Ideally, the discharge current drawn from capacitor C by current sink 50 will be such as to cause the decreasing portion 212 of the ramp voltage 210 at terminal 40 to reach the level of the voltage Vvalley in time coincidence with the low-to-high transition in the REF CLOCK signal 200. If the ramp voltage 210 reaches the level of the voltage Vvalley ahead of the low-to-high transition in the REF CLOCK signal 200, the current being drawn by the current sink is too large, and the output of the PLL will cause a reduction in the discharge current drawn by current sink 50. Conversely, if the ramp voltage 210 reaches the level of the voltage Vvalley subsequent to the low to high transition in the REF CLOCK signal 200, the current being drawn by the current sink is too small, and the output of the PLL will cause the current drawn by sink 50 to increase.

As can be seen from the steady state portion 81 of the timing diagrams of FIG. 2, the output of the PLL 60 is stable and the current being drawn by current source 50 is such that the ramp voltage 210 reaches the level of the voltage Vvalley in time coincidence with the low-to-high transition in the REF CLOCK signal 200. During this first portion 81, the input voltage Vin is at some initial steady state input voltage $Vin_{81}$ and, as shown at time t0, the ramp voltage 210 transitions from upper voltage $Vpeak=(Vin_{81}/N+Vvalley)$ to the valley voltage Vvalley in time coincidence with the low to high transition in the REF CLOCK signal 200.

At a time t1, which begins an interval 82, the input voltage Vin is shown as transitioning to a new input voltage $Vin_{82}$, which is at a higher level than the initial steady state input voltage $Vin_{81}$. As a consequence, during the next high portion 201 of the REF CLOCK signal, capacitor C is rapidly charged as shown by rising slope ramp portion 211A to a new value of the peak voltage $Vpeak=Vin_{82}/N+Vvalley$. During the succeeding low portion 202 of the REF CLOCK cycle 200, with the variable switch connection 32 coupled to the current sink 50, capacitor C begins discharging through the current source 50, as shown by the decreasing slope portion 212A. Due to the relatively low bandwidth of the PLL, however, several cycles of the REF CLOCK signal 200 are required for the output of the PLL to adjust the magnitude of the current sink 50, so that the capacitor will be discharged from its new peak voltage $(Vin_{82}/N+Vvalley)$ back down to the Valley voltage (Vvalley) during a single REF CLOCK cycle. This means that during a PLL adaptation period 83, the ramp voltage will be undesirably distorted. This, in turn, negatively impacts the operation of the DC—DC converter in which the oscillator is employed.

SUMMARY OF THE INVENTION

In accordance with the present invention, the above-described PLL bandwidth-based problem is successfully remedied by the feed-forward oscillator architecture of the present invention, which is configured to immediately adjust the slope of each rising and falling portion of the sawtooth/ramp signal, as necessary, in proportion to the magnitude of the input voltage, so that the multiple clock cycle adaptation period of the PLL of the circuit of FIG. 1 is effectively eliminated. For this purpose, the invention establishes a difference voltage between a set of peak and valley portions of the sawtooth/ramp signal in accordance with the input voltage Vin. If there is a change in the input voltage Vin, the value of the difference voltage between Vpeak and Vvalley is changed proportionately to Vin, to define a new set of respective peak and valley portions $Vpeak_{NEW}$ and $Vvalley_{NEW}$. This new set of respective peak and valley portions $Vpeak_{NEW}$ and $Vvalley_{NEW}$ is then immediately asserted, to cause the sawtooth waveform to transition from its previous set of respective peak and valley portions Vpeak and Vvalley to the new set of respective peak and valley portions $Vpeak_{NEW}$ and $Vvalley_{NEW}$, without any lag or change in frequency, namely, without undergoing excursions between peak and valley portions other than those of the new set of peak and valley portions $Vpeak_{NEW}$ and $Vvalley_{NEW}$, respectively over some multi clock cycle adaptation period.

Pursuant to a first embodiment, as in the circuit of FIG. 1, the input voltage Vin is coupled to a voltage divider containing a first resistor having a resistor value (N−1)R and a second resistor having a resistor value R coupled in series to an input terminal to which the voltage Vin is applied. However, rather than being referenced directly to ground as in the circuit of FIG. 1, the resistor network is coupled to ground by way of the drain-source path of a first current mirror input MOSFET. This input MOSFET has its gate coupled to the output of an amplifier. The positive input of the amplifier is coupled to the common connection of the second resistor and the drain of the first MOSFET, which has its source coupled to ground. The negative input of the amplifier is coupled to receive the reference valley voltage Vvalley. A second MOSFET is coupled in current mirror output configuration with the first MOSFET and has its drain supplying a current I that is proportional to (Vin−Vvalley)/RN.

In this configuration, the amplifier is operative to drive the gate of the first MOSFET, so as to force the voltage at its drain to be equal to the voltage Vvalley. The voltage at the common node between the resistors of the resistor network is (Vin−Vvalley)/N+Vvalley, so that Vpeak−Vvalley=(Vin−Vvalley)/N. This voltage is the peak voltage Vpeak and is coupled to a first input of a first comparator, a second input of which is coupled to ramp/sawtooth output terminal. The output of the first comparator is coupled to the set input of a Set/Reset flip-flop.

The valley voltage Vvalley is coupled to a first input of a second comparator, a second input is coupled to the ramp/sawtooth output terminal. The output of the second comparator is coupled to the reset input of the Set/Reset flip-flop. The flip-flop produces a constant frequency clock signal CLOCK that is used to control the operation of a current path switch. This switch has a low side terminal coupled to a current source and a high side terminal coupled to a current sink. Each of the current source and the current sink is operative to provide a current therethrough equal to the current mirrored by the current mirror's output MOSFET. The common node of the switch is coupled to the ramp output terminal and to an output storage capacitor.

The operation of the feed-forward oscillator architecture is such that during a steady state interval, the value of the input voltage Vin is at some given level and the flip-flop is in its set state, so that its Q output causes the current path switch to discharge the capacitor with a mirrored current via the current sink that is proportional to the drain current of the current mirror's input MOSFET, which is a function of input voltage. As the capacitor is discharged, its output voltage eventually drops to a level that trips the second comparator, resetting the flip-flop, and causing the capacitor to begin charging through the current source at the same mirrored current. As the capacitor is charged, its output voltage eventually reaches the threshold of and trips the first comparator, to again set the flip-flop and cause the capacitor to begin discharging through the current sink. Namely, the Q (or QBAR) output of the flip-flop is alternately switched high and low (or low and high) to produce a waveform CLOCK signal, as the voltage across the capacitor is charged and discharged to the thresholds of the first and second comparators.

In response to a change in input voltage at an arbitrary instant in time—for example, during the discharge of the capacitor—the input voltage Vin may undergo a step transition from its current level to a second, higher level. This step increase in input voltage Vin causes the current through the input MOSFET of the current mirror to be immediately proportionately higher, so that current mirrored by the current mirror's output MOSFET and thereby provided by each of the current source and current sink will likewise increase to a proportionately higher value. This causes the output capacitor to now be discharged more rapidly, so that the voltage across the capacitor will exhibit a steeper slope. As a result, during the next and succeeding cycles of the clock and ramp waveforms, this increased value of current is used to charge and discharge the capacitor more rapidly, thereby maintaining the switching rate of the flip-flop and the frequency of the ramp/sawtooth waveform produced across the output capacitor constant.

In accordance with a second embodiment, temperature compensation circuitry, in the form of a temperature-compensated phase locked loop, is used to augment the value of the mirrored current produced by the current mirror circuit and employed by the current source and current sink through said charge/discharge path for the capacitor, to compensate for temperature variations in the resistors of the resistor divider network.

DETAILED DESCRIPTION

Before describing several embodiments of the feed-forward oscillator of the present invention, it should be observed that the invention resides primarily in arrangements of conventional circuit components, and the manner in which they may be incorporated into a feed-forward oscillator of the type described above. It is to be understood that the invention may be embodied in a variety of other implementations, and should not be construed as being limited to only the embodiment shown and described herein. Rather, the implementation example shown and described here is intended to supply only those specifics that are pertinent to the present invention, so as not to obscure the disclosure with details that are readily apparent to one skilled in the art having the benefit of present description. Throughout the text and drawings like numbers refer to like parts.

Figure 3:
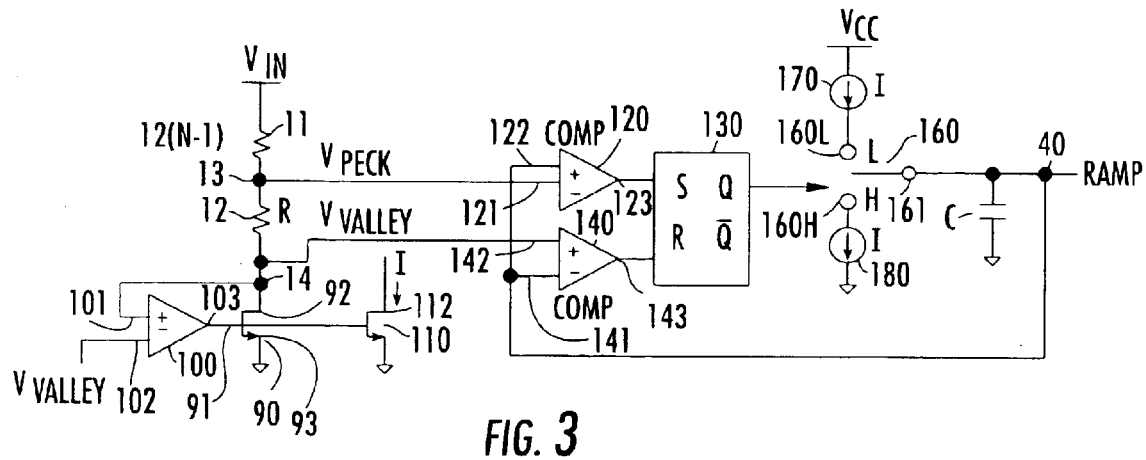
FIG. 3 diagrammatically illustrates a feed-forward oscillator in accordance with a first embodiment of the invention.

Attention is now directed to FIG. 3, which diagrammatically illustrates a first embodiment of the new and improved feed-forward oscillator of the invention. As in the circuit of FIG. 1, an input voltage Vin is coupled to a voltage divider comprised of a first resistor 11 having a resistor value R11=(N−1)R and a second resistor 12 having a resistor value R12=R coupled in series to an input terminal to which Vin is applied. However, rather than being referenced directly to ground as in the prior art circuit of FIG. 1, resistor 12 is coupled to ground by way of the drain-source path of a first current mirror input NMOS FET 90. NMOS FET 90 has its gate 91 coupled to the output 103 of an amplifier 100.

A first (+) input 101 of amplifier 100 is coupled to the common connection 14 of resistor 12 and the drain 92 of MOSFET 90, the source 93 of which is coupled to GND, while a second (−) input 102 of comparator 100 is coupled to receive the valley voltage Vvalley. A second NMOS FET 110 is coupled in current mirror output configuration with NMOS FET 90, with its drain 112 supplying a current I that is proportional to (Vin−Vvalley)/RN.

In the configuration shown, amplifier 100 drives the gate 91 of NMOS FET 90, so as to force the voltage at its drain 92 (node 14) to be equal to the voltage Vvalley. The voltage at the common connection or node 13 between resistors 11 and 12 is (Vin−Vvalley)/N+Vvalley, so that Vpeak− Vvalley=(Vin−Vvalley)/N. This voltage is the peak voltage Vpeak and is coupled to a first (−) input 121 of a comparator 120, a second input 122 of which is coupled to ramp/sawtooth output terminal 40. The output 123 of comparator 120 is coupled to the set input S of a Set/Reset flip-flop 130.

The valley voltage Vvalley is coupled to a first (+) input 142 of a comparator 140, a second input 141 is coupled to the ramp output terminal 40. The output 143 of comparator 140 is coupled to the reset input R of Set/Reset flip-flop 130. The Q output of flip-flop 130 produces a (constant frequency) clock signal CLOCK that is used to control the operation of a switch 160. Switch 160 has a low side terminal 160L coupled to a current source 170 and a high side terminal 160H coupled to a current sink 180. Each of current source 170 and current sink 180 is operative to provide a current therethrough equal to I corresponding to the current mirrored by MOSFET 110. The common node 161 of switch 160 is coupled to the ramp output terminal and capacitor C.

Figure 4:
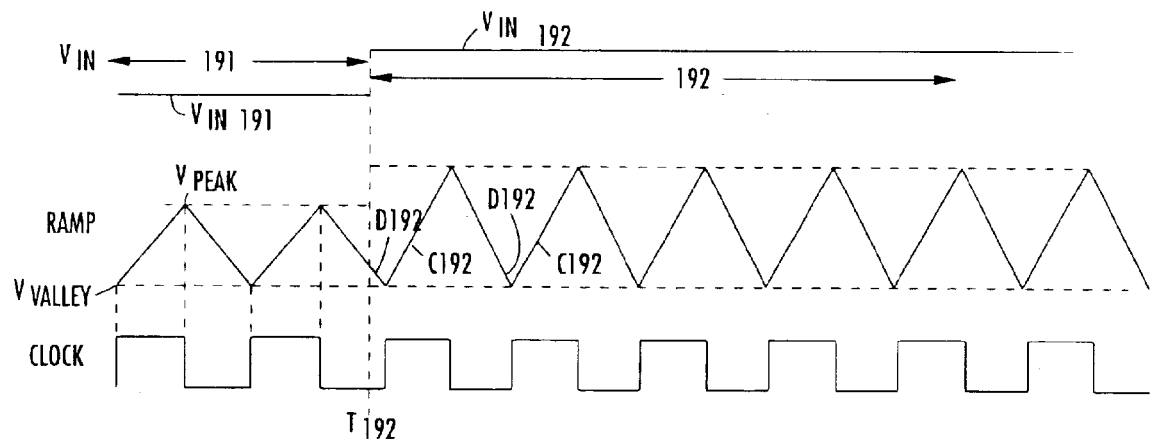
FIG. 4 contains a set of timing diagrams associated with the operation of the feed-forward oscillator of FIG. 3.

The operation of the feed-forward oscillator architecture of FIG. 3 may be understood by reference to the timing diagrams of FIG. 4. During a first steady state interval 191, the value of the input voltage Vin is at a first level $Vin_{191}$. During a second interval 192 that starts with a transition in the input voltage at a time t192, the input voltage is increased to a second, higher voltage level $Vin_{192}$. During the first interval 191, flip-flop 130 is in its set state, so that its Q output causes switch 160 to discharge the capacitor C with a mirrored current I from current sink 180 that is proportional to the drain current of MOSFET 90, which is a function of the input voltage (here $Vin_{191}$).

As capacitor C is discharged, its output voltage eventually reaches the threshold of comparator 140. This causes the output of comparator 140 to change state, so as to reset the flip-flop 130, and cause capacitor C to begin charging through current source 170 at the same mirrored current I. As capacitor C is charged, its output voltage eventually reaches the threshold of comparator 120. This causes the output of comparator 120 to change state, which again sets flip-flop 130 and causes the capacitor C to begin discharging through current sink 180, as described above.

Thus, the Q (or QBAR) output of flip-flop 130 is alternately switched high and low (or low and high) to produce a waveform CLOCK signal, as the voltage across the capacitor C is charged and discharged to the thresholds of the comparators 120 and 140. The period of this waveform CLOCK is defined by Ohms law as T=CdV/I, where dV=2 (Vpeak−Vvalley)=2(Vin−Vvalley)/N, and I=(Vin−Vvalley)/ NR, as described above. This defines the period T=2RC.

As pointed out above, and as shown in FIG. 4, at an arbitrary instant in time t192, e.g., during the discharge of capacitor C, the input voltage Vin undergoes a step transition from its first level $Vin_{191}$ to a second, higher level $Vin_{192}$. Since the input voltage Vin undergoes a step increase, the current through the NMOS FET 90 will now be immediately proportionately higher, so that current mirrored by current mirror transistor 110 and provided by current source 170 and current sink 180 to likewise increase to a proportionately higher value of I. Within the discharge interval containing time $t_{192}$ this causes capacitor C to now be discharged more rapidly, as shown by the increased slope portion D192 of the negative-going portion of the RAMP waveform of FIG. 4 beginning at time $t_{192}$. During the next and succeeding cycles of the clock and ramp waveforms, this increased value of current I is used to charge and discharge the capacitor more rapidly than during the initial interval 191, as shown by charging ramp portion C192 and discharging ramp portion D192, thereby maintaining the switching rate of flip-flop 130 constant.

Figure 5:
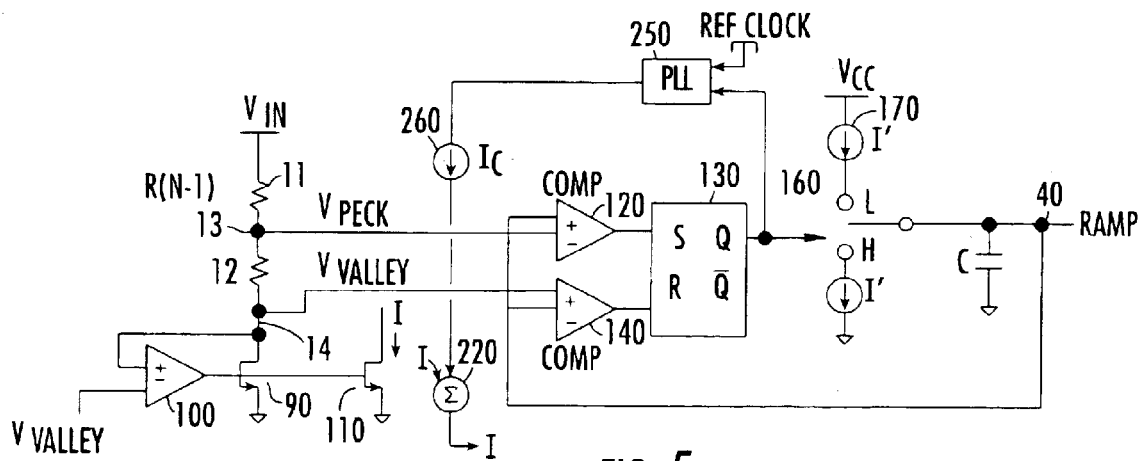
FIG. 5 diagrammatically illustrates a feed-forward oscillator in accordance with a second embodiment of the invention.

As described above, the embodiment of the feed-forward oscillator shown in FIG. 3 is operative to immediately adjust the slope of each rising and falling portion of the ramp signal in response to a change in the magnitude of the input voltage. However, because its frequency is defined in accordance with a resistive component (resistor value R), the circuit of FIG. 3 is subject to variation with temperature. To compensate for this variation, the circuit of FIG. 3 may be modified as shown in FIG. 5 to incorporate a PLL 250, to which the CLOCK waveform produced by flip-flop 130 is supplied. PLL 250 is further coupled to receive a (temperature-stable) reference clock signal, that corrects for any drift in the CLOCK signal waveform.

To this end, the output of PLL 250 is supplied to an auxiliary current source 260, which outputs a compensation current Ic. This compensation current is summed in an adder 270 with the current I output by current mirror NMOS FET 110 to produce a compensated current I'. Current source 170 and current sink 180 replicate this compensated current I', so that any change in resistance due to temperature is compensated to maintain a constant frequency of the generated ramp and CLOCK waveform signals, which are generated as described above. Since the PLL is there to compensate for temperature changes, and temperature changes are slow, the PLL can have a low bandwidth without lowering the bandwidth of the feed forward oscillator. The PLL can also be used to synchronize the clock to an external clock to control the phase delay between multiple clocks in a multi-phase system.

Figure 1:
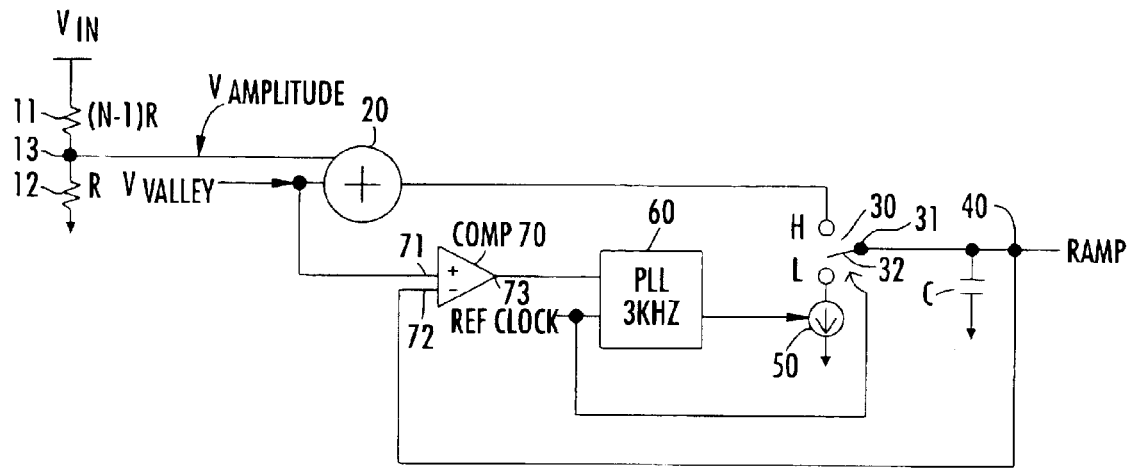
FIG. 1 diagrammatically illustrates a prior art feed-forward oscillator for generating a ramp/sawtooth waveform signal.
Figure 2:
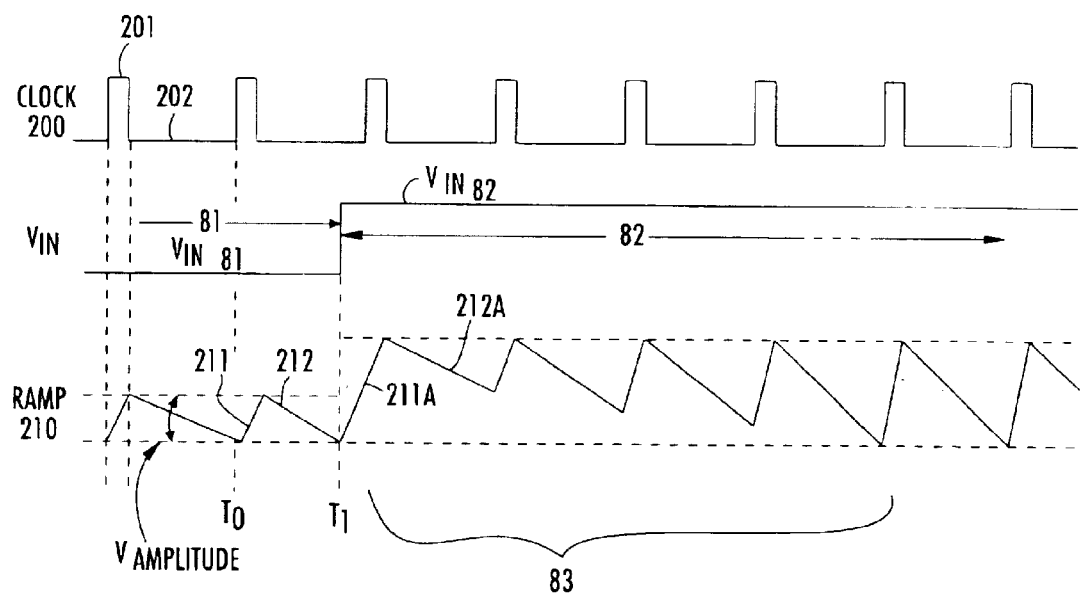
FIG. 2 contains a set of timing diagrams associated with the operation of the feed-forward oscillator of FIG. 1.

As will be appreciated from the foregoing description, the above-described PLL bandwidth-based problem is successfully remedied by the feed-forward oscillator architecture of the present invention, which is configured to immediately adjust the slope of each rising and falling portion of the sawtooth/ramp signal, as necessary, in proportion to the magnitude of the input voltage, so that the multiple clock cycle adaptation period of the PLL of the circuit of FIG. 1 is effectively eliminated.

While I have shown and described several embodiments in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed:

1. A high bandwidth feed-forward oscillator for generating a sawtooth waveform at a prescribed frequency, said sawtooth waveform undergoing successive excursions between respective ones of a set of peak and valley portions Vpeak and Vvalley, comprising:
   an input port to which a variable input voltage Vin is coupled;
   an output port from which said sawtooth waveform is derived;
   a network coupled to said input port and being configured to output said peak voltage value Vpeak for said sawtooth output voltage in proportion to a difference between said input voltage Vin and said valley voltage Vvalley;
   an amplifier having a first input port coupled to said network and a second input port coupled to receive a voltage value corresponding to said valley voltage value Vvalley for said sawtooth output voltage;
   a current mirror circuit which is coupled to be driven by said amplifier and is operative to produce a current I in proportion to the voltage difference (Vin−Vvalley);
   a capacitor coupled to said output port and being alternately charged and discharged by said current I; and
   a switching circuit which is operative to supply said current I to said capacitor and thereby charge said capacitor until the voltage across said capacitor reaches said peak voltage value Vpeak, and thereafter sink said current I from said capacitor and thereby discharge said capacitor until the voltage across said capacitor reaches said valley voltage value Vvalley.

2. The high bandwidth feed-forward oscillator according to claim 1, wherein said switching circuit comprises a first comparator having a first input coupled to receive said peak voltage value, and a second input coupled to said output port, a second comparator having a first input coupled to receive said valley voltage value, and a second input coupled to said output port, and a control circuit which is operative to couple said current I to said capacitor and thereby charge said capacitor until the voltage at said output port reaches said peak voltage value Vpeak, thereby causing said first comparator to change state, arid thereafter sink said current I from said capacitor and thereby discharge said capacitor until the voltage at said output port reaches said voltage value Vvalley, thereby causing said second comparator to change state.

3. The high bandwidth feed-forward oscillator according to claim 2, wherein said switching circuit further comprises a flip-flop having a first input coupled to the output of said first comparator and a second input coupled to the output of said second comparator, and an output coupled to steer a charge/discharge path for said capacitor between respective current source and sinks for said current I.

4. The high bandwidth feed-forward oscillator according to claim 1, further comprising temperature compensation circuitry for adjusting said current I produced by said current mirror circuit.

5. The high bandwidth feed-forward oscillator according to claim 4, wherein said temperature compensation circuitry includes a temperature-compensated phase locked loop, which is operative to augment the value of said current I produced by said current mirror circuit and used to source and sink current through said charge/discharge path for said capacitor.

6. A circuit for generating a sawtooth waveform at a prescribed frequency, said sawtooth waveform undergoing successive excursions between respective ones of a set of peak and valley portions Vpeak and Vvalley, said circuit comprising:
   a comparator network which is operative to establish said difference between said set of peak and valley portions in accordance with an input voltage Vin; and
   a control circuit which is operative, in response to a change in said input voltage Vin, to modify the value of said difference between said peak and valley portions and thereby define a new set of respective peak and valley portions $Vpeak_{NEW}$ and $Vvalley_{NEW}$, and to immediately cause said sawtooth waveform to transition from said set of respective peak and valley portion Vpeak and Vvalley to said new set of respective peak and valley portions $Vpeak_{NEW}$ and $Vvalley_{NEW}$ at said prescribed frequency, without undergoing excursions between peak and valley portions other than said new set of peak and valley portions $Vpeak_{NEW}$ and $Vvalley_{NEW}$, respectively; and wherein
   said comparator network comprises an input port to which a variable input voltage Vin is coupled, and including a voltage divider network that is operative to output said peak voltage value Vpeak for said sawtooth output voltage in proportion to a difference between said input voltage Vin and said valley voltage Vvalley, and including an amplifier having a first input port coupled to said voltage divider network and a second input port coupled to receive a voltage value corresponding to said valley voltage value Vvalley for said sawtooth output voltage, and a current mirror circuit which is coupled to be driven by said first comparator and is operative to produce a current I in proportion to the voltage difference (Vin−Vvalley); and wherein said control circuit includes a capacitor coupled to said output port arid being alternately charged and discharged by said current I, and a switching circuit which is operative to supply said current I to said capacitor and thereby charge said capacitor until the voltage across said capacitor reaches said peak voltage value Vpeak, and thereafter sink said current I from said capacitor and thereby discharge said capacitor until the voltage across said capacitor reaches said valley voltage value Vvalley.

7. The circuit according to claim 6, wherein said comparator network is operative to establish said difference between said set of peak and valley portions Vpeak and Vvalley in proportion to the difference between said input voltage Vin and said valley voltage Vvalley.

8. The circuit according to claim 7, wherein said control circuit is operative, in response to said change in said input voltage Vin, to successively charge and discharge a capacitor with a current that is proportional to ($Vin_{NEW}$−$Vvalley_{NEW}$), with the voltage across said capacitor corresponding to said sawtooth waveform.

9. The circuit according to claim 6, wherein said switching circuit comprises a first comparator having a first input coupled to receive said peak voltage value, and a second input coupled to said output port, a second comparator having a first input coupled to receive said valley voltage value, and a second input coupled to said output port, and a control circuit which is operative to couple said current I to said capacitor and thereby charge said capacitor until the voltage at said output port reaches said peak voltage value Vpeak, thereby causing said first comparator to change state, and thereafter sink said current I from said capacitor and thereby discharge said capacitor until the voltage at said output port reaches said voltage value Vvalley, thereby causing said second comparator to change state.

10. The circuit according to claim 9, wherein said switching circuit further comprises a flip-flop having a first input coupled to the output of said first comparator and a second input coupled to the output of said second comparator, and an output coupled to steer a charge/discharge path for said capacitor between respective current source and sinks for said current I.

11. The circuit according to claim 6, further comprising temperature compensation circuitry for adjusting said current I produced by said current mirror circuit.

12. The circuit according to claim 11, wherein said temperature compensation circuitry includes a temperature-compensated phase locked loop, which is operative to augment the value of said current I produced by said current mirror circuit and used to source and sink current through said charge/discharge path for said capacitor.

13. A circuit for generating a sawtooth waveform at a prescribed frequency, said sawtooth waveform undergoing successive excursions between respective ones of a set of peak and valley portions Vpeak and Vvalley, said circuit comprising:

a comparator network which is operative to establish said difference between said set of peak and valley portions in accordance with an input voltage Vin; and a control circuit which is operative, in response to a change in said input voltage Vin, to modify the value of said difference between said peak and valley portions and thereby define a new set of respective peak and valley portions $Vpeak_{NEW}$ and $Vvalley_{NEW}$, and to immediately cause said sawtooth waveform to transition from said set of respective peak and valley portions Vpeak and Vvalley to said new set of respective peak and valley portions $Vpeak_{NEW}$ and $Vvalley_{NEW}$ at said prescribed frequency, without undergoing excursions between peak and valley portions other than said new set of peak and valley portions $Vpeak_{NEW}$ and $Vvalley_{NEW}$, respectively; and wherein said comparator network comprises an input port to which a variable input voltage Vin is coupled, and including a voltage divider network that is operative to output said peek voltage value Vpeak for said sawtooth output voltage in proportion to a difference between said input voltage Vin and said valley voltage Vvalley, and including a MOSFET having a gate and drain thereof shorted together and coupled to said voltage divider network coupled to receive a voltage value corresponding to said valley voltage value Vvalley for said sawtooth output voltage, and a current mirror circuit which is coupled to be driven by said first comparator and is operative to produce a current I in proportion to the voltage difference (Vin−Vvalley); and wherein said control circuit includes a capacitor coupled to said output port and being alternately charged and discharged by said current I, and a switching circuit which is operative to supply said current I to said capacitor and thereby charge said capacitor until the voltage across said capacitor reaches said peak voltage value Vpeak, and thereafter sink said current I from said capacitor and thereby discharge said capacitor until the voltage across said capacitor reaches said valley voltage value Vvalley.

\* \* \* \* \*